United States Patent
Bruno et al.

(10) Patent No.: US 7,030,597 B2
(45) Date of Patent: Apr. 18, 2006

(54) PHOTOVOLTAIC-TYPE CHARGER

(75) Inventors: Serge Bruno, Marnaz (FR); Serge Neuman, Seynod (FR)

(73) Assignee: Somfy SAS, Cluses (FR)

( * ) Notice: Subject to any disclaimer, the term of this patent is extended or adjusted under 35 U.S.C. 154(b) by 72 days.

(21) Appl. No.: 10/486,007

(22) PCT Filed: Aug. 8, 2002

(86) PCT No.: PCT/IB02/03161

§ 371 (c)(1),
(2), (4) Date: Feb. 4, 2004

(87) PCT Pub. No.: WO03/017446

PCT Pub. Date: Feb. 27, 2003

(65) Prior Publication Data

US 2004/0183982 A1    Sep. 23, 2004

(30) Foreign Application Priority Data

Aug. 14, 2001 (FR) .................................. 01 11228
May 3, 2002 (FR) .................................. 02 05656

(51) Int. Cl.
*G05F 5/00* (2006.01)
(52) U.S. Cl. .................. 323/299; 323/906; 363/80
(58) Field of Classification Search ............... 323/222, 323/285, 906, 284, 299, 283; 363/95, 89, 363/97; 307/66, 10.1; 136/293, 244
See application file for complete search history.

(56) References Cited

U.S. PATENT DOCUMENTS

| 4,175,249 | A |   | 11/1979 | Gruber ......................... 323/15 |
| 4,695,785 | A | * | 9/1987 | Mieth et al. ................. 323/222 |
| 4,794,272 | A | * | 12/1988 | Bavaro et al. ................ 307/66 |
| 5,779,817 | A | * | 7/1998 | Wecker ...................... 136/244 |

OTHER PUBLICATIONS

F. Mocci, M. Tosi; "Comparison of Power Coverter Technologies in Photovoltaic Applications". Proceedings of Melecon089. Integrating Research, Industry and Education in Energy and Communication Engineering, 1989, pp. 11-15, XP010083218, no date.

H. Darrelmann, "Alternative Power Storages". Proceedings of Telescon 97, Telecommunications Energy Specialist conference, Apr. 24, 1997, pp. 33-40, XP010268192.

(Continued)

*Primary Examiner*—Rajnikant B. Patel
(74) *Attorney, Agent, or Firm*—Frommer Lawrence & Haug LLP; Ronald R. Santucci

(57) ABSTRACT

A method of producing a photovoltaic panel that includes elementary photovoltaic cells in series and in parallel and intended for charging a low-voltage electrical energy accumulator via a voltage converter includes wiring a minimum number of elementary cells in series between the two terminals of the photovoltaic panel. The minimum number is established such that, under a given illumination, the knee voltage of the photovoltaic panel is greater than the threshold voltage of operation of the converter. The invention also relates to a device for charging a low-voltage accumulator via a converter comprising a photovoltaic panel obtained by this method.

13 Claims, 2 Drawing Sheets

OTHER PUBLICATIONS

J.A. Gow, C.D. Manning, "Controller Arrangement for Boost Converter Systems Sourced from Solar Photovoltaic Arrays or Other Maximum Power Sources". IEE Proc. Electr. Power Appl., vol. 147, No. 1, Jan. 2000.

H.D. Maheshappa, J. Nagaraju, M.V. Krishna Murthy, "An Improved Maximum Power Point Tracker Using A Step-Up Converter with Current Locked Loop". Renewable Energy, vol. 13, No. 2 pp. 195-201, 1998, no date.

Chihchiang Hua and Chihming Shen, "Study of Maximun Power Tracking Techniques and Control of DC/DC Converts for Photovoltaic Power System". Proccedings of Power Electronics Specialists Conference, 1998. PESC 98. Fukuoka, Japan May 17-22, 1998, pp. 86-93. XP010294948.

* cited by examiner

PHOTOVOLTAIC-TYPE CHARGER

BACKGROUND OF THE INVENTION

The invention relates to a method of producing a photovoltaic panel comprising elementary photovoltaic cells and intended for charging a low-voltage electrical energy accumulator via a voltage converter and a device comprising a low-voltage electrical energy accumulator, a step-up voltage converter, a photovoltaic panel comprising elementary photovoltaic cells and intended for charging the accumulator via the converter.

DESCRIPTION OF THE PRIOR ART

The field of the charging device according to the invention is that of low-voltage accumulators for which there commonly exist direct-wired photovoltaic panels, that is to say ones wherein there is sufficient internal serialization of the cells (or elementary photocells) to obtain, under solar exposure, a panel no-load voltage greater than the voltage of the accumulator, and hence allowing direct charging of the accumulator through its electrical linkup to the panel.

More precisely, the invention relates to devices of the photovoltaic type, intended to satisfy the charging of an electric accumulator under highly variable circumstances of illumination. In particular, the devices using a method according to the invention lend themselves to accumulator charging when the illumination available decreases greatly with respect to its nominal value.

Similarly, the invention applies not only to electrochemical accumulators, but also to the charging of electrical energy accumulator elements in electrostatic form (with or without polarization), such as capacitors or supercapacitors.

It is known not to directly use the output of photovoltaic panels in energy collector devices. American patent U.S. Pat. No. 4,494,180 cites very many scientific references to work undertaken in the search for an optimal operating point. This approach is known by the abbreviation MPPT: "maximum power point tracking".

It is concerned with operating the panel according to voltage and current drawn conditions that correspond to the power maximum. Such an optimal point is represented by the reference (48) in FIG. 2 of the cited patent. It is situated at the knee of the current/voltage characteristic.

This patent describes in particular how to optimize the power in such a way as to supply a motor directly, without even going via an accumulator.

It will be pointed out that in this patent use is made of a DC/DC converter of ratio N, as in the present invention, but it is a step-down (buck) rather than a step-up (boost) converter. It is concerned with varying the apparent load seen by the panel, in such a way as to remain at the knee of the characteristic curve, current/voltage of the panel, whatever the illumination or the temperature.

Moreover, the same concern for apparent impedance matching of the load, seen by the panel, will be found in the earlier American patent U.S. Pat. No. 3,384,806.

American patent U.S. Pat. No. 3,696,286, is concerned with driving at least one variable-frequency converter through the difference between the voltage delivered by at least one main panel, operating under load, and a reference cell, operating at no load while being placed under the same conditions of temperature and illumination as the main panel.

The converter structure is that of a conventional booster, but the latter explicitly plays the role of power amplifier, rather than voltage amplifier, as represented in FIG. 1 and claimed. The aim is to automatically decrease the power demanded by the load if the available power of the panel decreases: this again entails a matching system, of MPPT type.

This patent provides for the use of several amplifiers, each operating at variable frequencies, to balance the output voltages of panels placed in parallel.

American patent U.S. Pat. No. 4,695,785 describes an MPPT device as regards variations in illumination and/or in temperature. The driving of the device at the maximum power available is carried out by periodically (and briefly) measuring the available short-circuit current. This value is used to act on a switching regulator in order to match the power demanded by the load to the power available.

It will be pointed out that the abstract of the invention does not mention the boost or buck nature of the switching regulator. In the description of the preferred embodiment, it is however mentioned (col. 4, line 34) that the components are those of a boost converter, corresponding to FIG. 1, but this characteristic is obviously not essential since it is clearly stipulated in the description of FIG. 1 (col. 7, line 27) that this structure is taken as a current regulator. It is indicated in the next paragraph that other regulator setups could equally well be used as converters of "blocking" or "forward" type.

In the known devices of the prior art, the aim is exclusively to get closer to the working conditions at the knee of the output characteristic, current/voltage curve, of the panel, whereas the device of the invention is designed to preferentially utilize the zone in which the photovoltaic panel works as a current generator, that is to say the horizontal part of the current-voltage curve, though the power is not optimal, the aim being to yield as high a current as possible.

Let us add that the device of the invention is advantageously used, for example, for the supply of DC motors for the temporary and infrequent moving of solar protections or the like, from the accumulator. It applies to any other use in which it is desired to be able to profit equally from situations of low ambient luminosity and situations of direct illumination of the panel, to allow the charging of the accumulator or the capacitor.

SUMMARY OF THE INVENTION

Thus, according to the invention, the method of dimensioning and using a photovoltaic panel of given area intended for low-voltage electrical energy accumulator charging is characterized in that the internal structure of the panel is defined in such a way as to deliver, under given illumination, as high as possible a short-circuit current provided that the knee voltage of the panel or at least its no-load voltage, remains above the operating threshold of a step-up voltage converter interposed between said panel and said accumulator.

The method of producing a photovoltaic panel according to the invention is characterized in that a minimum number of elementary cells is wired in series between the two terminals of the photovoltaic panel, this minimum number being defined in such a way that, under a given illumination, the knee voltage of the photovoltaic panel is greater than the threshold voltage of operation of the converter.

The minimum number of elementary cells wired in series can be defined in such a way that, under a given illumination, the no-load voltage of the photovoltaic panel is greater than the threshold voltage of operation of the converter.

The invention also relates to a device comprising a low-voltage electrical energy accumulator, a step-up voltage converter, a photovoltaic panel comprising elementary photovoltaic cells and intended for charging the accumulator via the converter, characterized in that the connection of the elementary cells of said panel is essentially parallel, the series connections being limited to what is necessary for obtaining a panel knee voltage or a no-load voltage of the panel which is greater than the threshold voltage of operation of the converter.

According to a complementary characteristic, all the elementary cells of the panel are connected in parallel.

According to another characteristic, the step-up converter uses a constant frequency and/or a constant duty ratio.

Let us note that the converter exhibits active periods of operation and inactive periods, which inactive periods are exploited in order to charge with the aid of the panel, a storage capacitor arranged upstream of the converter.

According to another characteristic, the converter comprises an oscillator furnished with an input disabling the operation of the converter if the voltage on this input becomes less than a given threshold voltage, and then keeps it disabled as long as this voltage has not regained a value greater than the threshold voltage.

According to two variant embodiments, the electrical energy accumulator is of electrochemical type, or of capacitor or supercapacitor type.

Other characteristics and advantages of the invention will emerge from the description which follows in conjunction with the appended drawings which are given merely by way of nonlimiting examples.

DETAILED DESCRIPTION OF THE INVENTION

Figure 1:
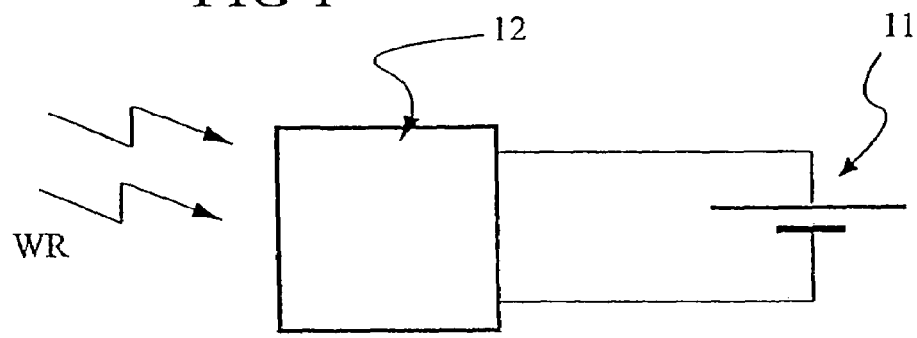
FIG. 1 is a view illustrating the traditional device.

FIG. 1 represents a traditional charging device (12) for charging an accumulator (11) of nominal voltage (UA), said device being of the photovoltaic panel type, comprising a configuration of elementary cells giving a no-load voltage (UB) greater than the nominal voltage (UA) of the accumulator, for nominal illumination (WR).

For example, if the accumulator has a nominal voltage of 24 volts, and if the no-load voltage of an elementary cell is 0.8 volts, the panel will have to contain at least 30 groupings of elementary cells, these groupings being linked in series. Inside each grouping, the cells are connected in parallel.

Figure 2:
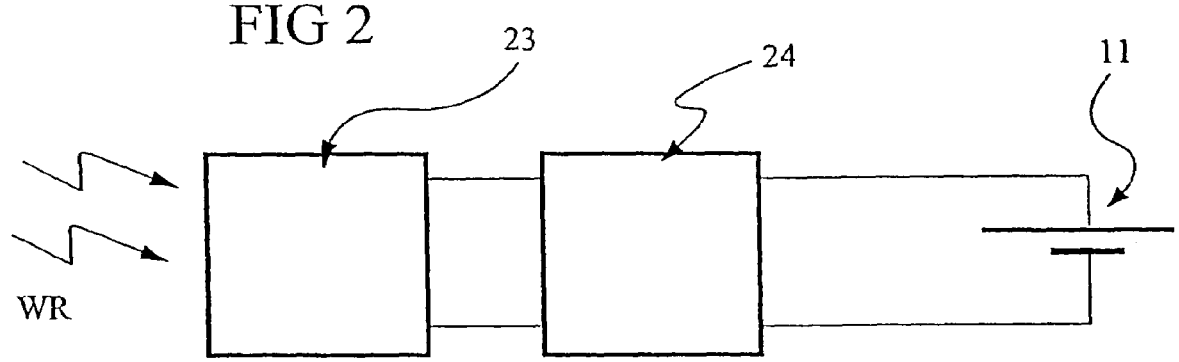
FIG. 2 is a diagrammatic view of the device according to the invention.

FIG. 2 represents a charging device according to the invention.

For one and the same panel area, and for the same accumulator as above, the method according to the invention consists in rather choosing a configuration of the panel of cells (23) giving a no-load voltage of the panel (UB2) equal to the previous no-load voltage (UB) divided by a multiplier coefficient (N) for this same value of nominal illumination, and in interposing between the panel and the accumulator (11) a step-up voltage converter element (24) with multiplicative factor equal to the multiplier coefficient (N), this latter (N) normally being constant, greater than unity and as large as possible.

In the preferred embodiment of a device according to the invention, this converter (24) possesses at least one intermittent mode of operation, associated with an element for upstream storage of electrical energy.

Figure 3:
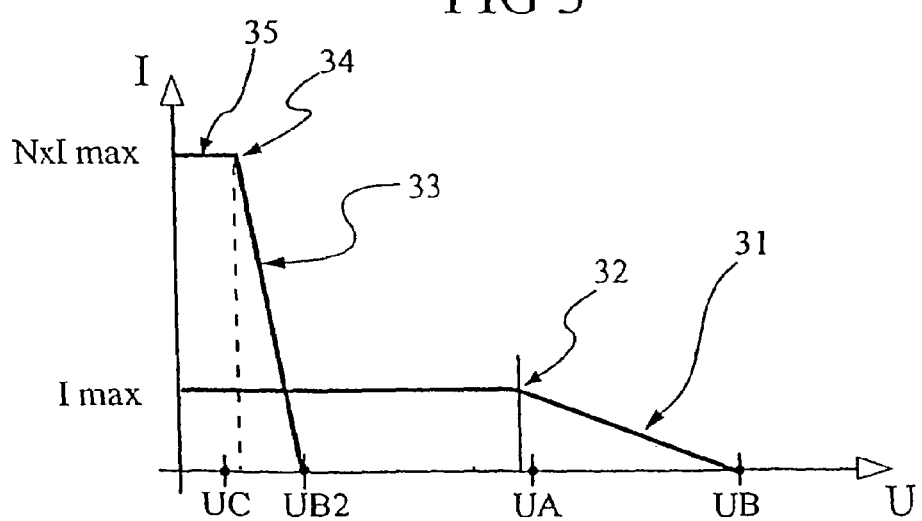
FIG. 3 is a graphical representation of the charging curve of a traditional device and of the device according to the invention.

A conventional device for charging an accumulator of nominal voltage (UA) leads to choosing a panel such that the current/voltage (I/U) charging curve exhibits a no-load voltage (UB) greater than the nominal voltage (UA) of the accumulator, as represented diagrammatically in FIG. 3, by the curve (31).

To facilitate the description, it will be assumed for example that this voltage has been obtained by placing four groupings of elementary photovoltaic cells in series in the panel.

At the optimum, as in all "MPPT" (maximum power point tracking) devices, the operating point is chosen, in the prior art, such that the nominal voltage (UA) of the accumulator corresponds to the knee (32) of the curve (31).

As a break with current practice, the invention advocates, for one and the same area of photovoltaic panel, that the value of the maximum strength (I max) of the short-circuit current be favored to the detriment of the new no-load voltage of the panel (UB2). Relative to normal dimensioning, the former no-load voltage (UB) will be divided by the multiplier coefficient (N), (UB2=UB/N), whereas the value of the strength of the current will be multiplied by the same factor. Curve (33) is then obtained.

In the example, the four groupings of cells of the panel are now arranged in parallel: the output voltage of the panel is four times smaller and is therefore less than the nominal voltage of the accumulator, but the maximum current that the panel can provide has become four times larger.

The invention does not seek specifically to track the maximum power point (34), but will preferably use the range (35) within which the panel behaves as a current generator.

It will be pointed out that, for large values of the multiplier coefficient (N), the characteristic (33) tends moreover to become rectangular, and that it is not possible to remain, in a stable manner, elsewhere than on the range (35). The knee voltage and no-load voltage then have substantially the same value.

Of course, this panel dimensioning makes it necessary to interpose a voltage booster device so as to allow the charging of the accumulator. For simplicity, the same value (N) as above will be taken as multiplicative factor, but it would be equally possible to take a different value (M), provided that the no-load voltage multiplied by the multiplier coefficient (N) or by the coefficient of different value (M) is greater than the nominal voltage (UA) of the accumulator.

This photovoltaic panel dimensioning may seem very surprising since it leads to the need for a step-up converter that could very easily be dispensed with through normal dimensioning. However, its benefit resides in the capacity of the panel to provide current even in circumstances of weak illumination, this current being utilized, within a much larger dynamic swing (here around N times larger than by comparison with the prior art).

In practice, the multiplier coefficient (N) can take as large a value as possible (not necessarily integer). There is however a technological limitation: it is imperative that the panel no-load voltage (UB) divided by the multiplier coefficient (N) remains greater than the minimum input voltage (UC) allowing operation of a step-up converter based on semiconductors or the like.

Stated otherwise, the invention promotes the placing in parallel of the elementary cells of a panel of given area (S).

Ideally, the design according to the invention amounts to using a photovoltaic panel comprising only cells in parallel for a given total area. The technology for producing the converter should then exhibit a minimum operating voltage (UC) which is less than the knee voltage or at least than the no-load voltage of an elementary cell of the photovoltaic panel.

Should these ideal characteristics not be achieved, the dimensioning of the panel according to the invention will simply have to limit the number of series connections of groupings of cells to what is necessary for obtaining a panel knee voltage, or at least no-load voltage (UB2), which is greater than the operating threshold (UC) of the converter.

In the current state of converter technology, this operating threshold is of the order of 1 volt.

For a knee voltage of the elementary cells equal to 0.5 volts, a panel will for example be taken whose area is divided into three groupings in series, interposing such a boost converter taken with a multiplier coefficient of 10 to apply the invention to the charging of a 12-volt accumulator. According to the prior art, the panel area would have been divided into at least 24 groups connected in series.

If it is assumed that an advance in photovoltaic technology gives a knee voltage equal to 1.5 volts for a photovoltaic elementary cell, then the application of the method according to the invention in respect of the charging of a 12-volt accumulator will consist in using elementary cells in parallel over the entire area of the panel, whereas the prior art would have distributed this area into nine or ten groups connected in series.

As a principle, if there is a total number of cells equal to T on the area S of the panel, and if the threshold voltage of the converter requires that P cells be placed in series in order to obtain a no-load voltage at least greater than the threshold voltage, and if we have T=P.Q with Q an integer, then it is equivalent to producing: either P groupings of Q cells in parallel, these P groupings being connected in series, or Q times the placing in parallel of P cells in series. The invention applies equally to either case. Technological reasons, in particular regarding the balancing of the currents and/or voltages in the various cells or groupings, in fact cause one or the other option to be chosen. What is important is that P, according to the invention, will be taken as small as possible so as to maximize Q.

The above principles are retained in the case where it is necessary to charge a capacitor rather than an electrochemical accumulator. The voltage (UA) defined above as being the nominal voltage of the accumulator will now be defined either as the voltage at which the charging of the capacitor stops, or as the mean value of a charging voltage in an operating mode that tolerates a small excursion either side of this value.

Figure 4:
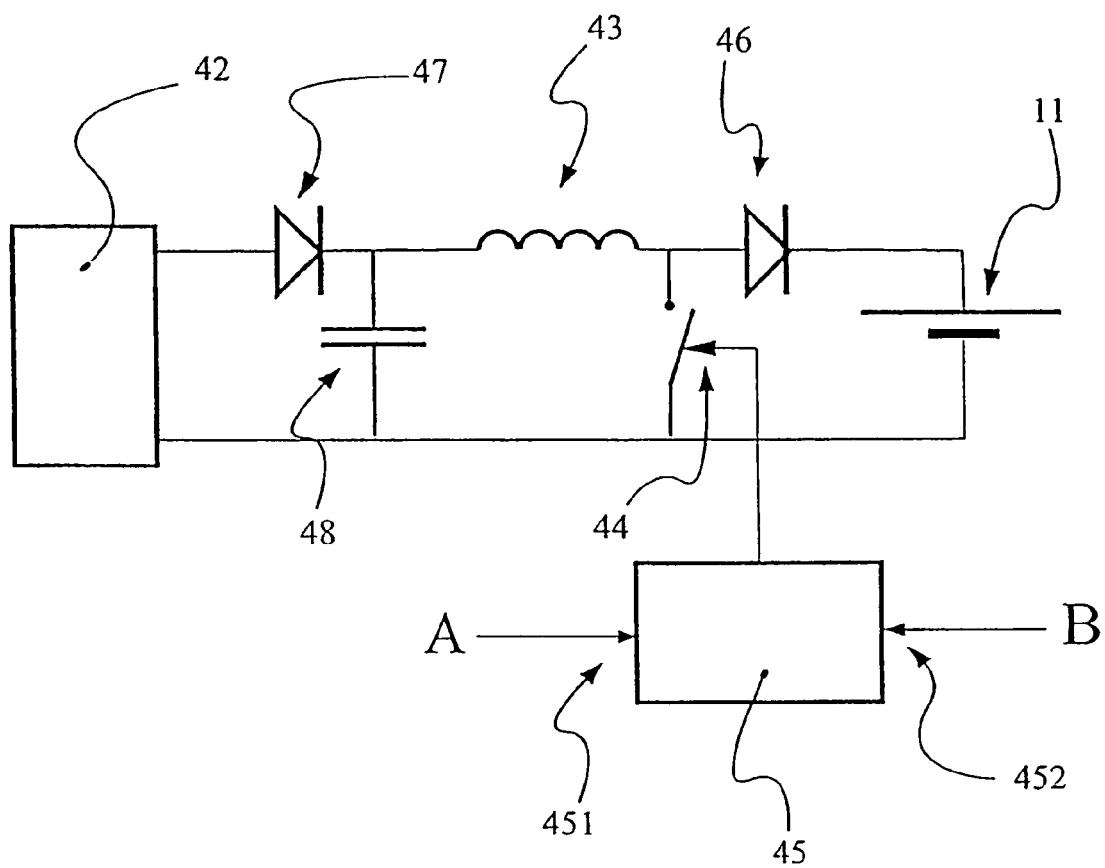
FIG. 4 is a diagrammatic view of the charging device according to the invention and in particular of its step-up converter.

FIG. 4 diagrammatically illustrates a device in which the panel (42) is dimensioned according to the method of the invention for the charging of an accumulator (11). Other devices that are not represented may be wired up in parallel with this accumulator.

The step-up converter (24) here comprises an inductor (43), an on/off switch (44) driven by an oscillator (45) whose duty ratio defines the voltage boost, and operating for example at constant frequency, and finally a diode (46) connected to the accumulator. Any other boost structure known to the person skilled in the art would be as suitable.

Such a setup allows for example the charging of a 6-volt accumulator from a panel which will be chosen to deliver a no-load voltage of 2.8 volts. The duty ratio is then chosen to be 0.8, this giving a normal multiplicative factor of the converter equal to 5. It is noted that all the conditions according to the invention are fulfilled, with a certain safety margin.

This setup also comprises an additional diode (47) and a capacitor (48), which makes it possible to produce an upstream storage element. Furthermore, the oscillator (45) is furnished with an input (451) disabling the operation of the converter (24) if the voltage on this input becomes less than a given threshold voltage (U1), and then keeps it disabled so long as this voltage has not regained a value at least equal to (U2), greater than (U1). The value (U1) is taken equal to or slightly greater than the operating threshold voltage (UC) of the converter.

In a first simplified version, the diode (47) could be replaced with a conducting wire, and the capacitor (48) could be dispensed with. It is also possible to retain one without the other.

It should be noted that certain circuits, used under conditions of low supply voltage, exhibit this dual-threshold behavior spontaneously. Thus, the LT1613 circuit from Linear, that carries out all of the booster and oscillator function, naturally ceases operating if its voltage becomes less than around 0.99 volts, and resumes for a voltage equal to around 1.1 volts.

The setup with diode and input capacitor is known to the person skilled in the art, this setup being such as to avoid invoking the panel directly when the on/off switch is conductive.

However, here it takes another function, in association with the input (451), or the intrinsic manner of operation equivalent to this input, that of a manner of operation of relaxation type.

Figure 5:
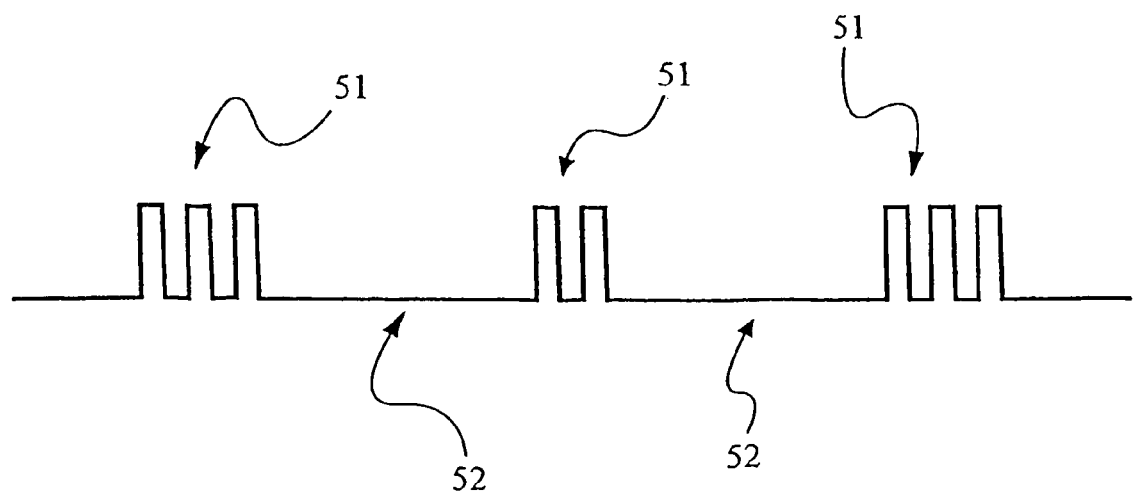
FIG. 5 illustrates the manner of operation and depicts the conductive times for the on/off switch of the converter.

FIG. 5 illustrates such a manner of operation, depicting the conductive times of the on/off switch.

Under the conditions of low illumination, this manner of operation involves "puffs", delivering a few pulses when the low current delivered by the panel has been able to charge the capacitor sufficiently to reach the threshold voltage (U2), thereby immediately bringing about the operation of the converter, and hence the discharging of the upstream storage capacitor, until (U1) is reached. The converter then ceases operating until the upstream storage capacitor has been able to recharge at a voltage (U2).

In certain cases of low charging current, arising from the panel, only a few pulses (51) are then available, and in the limit a single switching cycle of the on/off switch. These groups of pulses are separated by a quiescent time (52) which decreases as the current provided by the panel increases. As soon as the current drawn becomes sufficient, conduction becomes continuous, that is to say the on/off switch operates permanently with the fixed frequency and the fixed duty ratio and the current charging the accumulator (or any device placed in parallel with the accumulator) is no longer interrupted.

With this configuration no electric charge provided by the photovoltaic panel is lost.

In the preferred embodiment, the diode (47) is not used, so as to avoid an additional voltage drop.

Finally, use may also be made of a disabling input (452) in the case where the output voltage would exceed the maximum voltage of the accumulator at full charge.

In the case where it is a capacitor (or supercapacitor) (11) that is charged with the device according to the invention, it will be pointed out that one benefits from transparent operation of the step-up converter so long as, in an initial operating phase, the capacitor has not reached a voltage at least equal to the threshold voltage of the converter. Specifically, almost the entire current delivered by the panel passes through the inductor (43) and the diode (46) to charge the capacitor (11), the capacitance of which is normally very large compared with that of the upstream capacitor (48).

The duty ratio of the converter can be chosen to vary in such a way as to optimize the conductive time of the on/off switch (44) in the subsequent phase of steady growth of the voltage across the terminals of the capacitor (11) during the charging thereof. The disabling input (452) is used to terminate the charging beyond a given value of voltage.

Of course, the invention is not limited to the embodiments described and represented by way of examples, but it also comprises all technical equivalents as well as their combinations.

The invention claimed is:

1. A method of producing a photovoltaic panel comprising elementary photovoltaic cells in series and in parallel and intended for charging a low-voltage electrical energy accumulator via a voltage converter, wherein a minimum number of elementary cells is wired in series between the two terminals of the photovoltaic panel, the minimum number being defined in such a way that, under a given illumination, the knee voltage of the photovoltaic panel is greater than the threshold voltage (UC) of operation of the converter, wherein a set-up voltage converter having a constant multiplicative factor is used.

2. The method of claim 1, wherein the minimum number of elementary cells wired in series is defined in such a way that, under a given illumination, the no-load voltage (UB2) of the photovoltaic panel is greater than the threshold voltage (UC) of operation of the converter.

3. A device comprising:
a low-voltage electrical energy accumulator;
a step-up voltage converter having a constant multiplicative factor;
a photovoltaic panel comprising elementary photovoltaic cells in series and in parallel and intended for charging the accumulator via the converter, wherein
interconnection of the elementary photovoltaic cells of said panel is essentially parallel, the series connections being limited to what is necessary for obtaining at least one of: a panel knee voltage, and a no-load voltage (UB2), of the panel which is greater than the threshold voltage of operation (UC) of the converter.

4. The device of claim 3, wherein all the elementary cells of the panel are connected in parallel.

5. The device of claim 3, wherein the step-up converter uses a constant frequency ratio.

6. The device of claim 3, wherein the step-up converter uses a constant duty ratio.

7. The device of claim 3, wherein the converter exhibits active periods of operation and inactive periods, the inactive periods being exploited to charge with the aid of the panel, a storage capacitor arranged upstream of the converter.

8. The device of claim 7, wherein the converter comprises an oscillator having an input disabling the operation of the converter if the voltage on the input becomes less than a threshold voltage (U1), and then keeps it disabled as long as the voltage on the input has not regained a value at least equal to (U2), greater than (U1).

9. The device of claim 3, wherein the electrical energy accumulator is of electrochemical type.

10. The device of claim 3, wherein the electrical energy accumulator is of capacitor type.

11. The device of claim 3, wherein the electrical energy accumulator is of supercapacitor type.

12. The device of claim 3, wherein the panel knee voltage of the panel is of the order of a volt.

13. The device of claim 3, wherein the no-load voltage of the panel is of the order of 1 volt.

* * * * *